(12) United States Patent
Lewis, II et al.

(10) Patent No.: US 7,952,869 B2
(45) Date of Patent: May 31, 2011

(54) AIR DIVERTER FOR DIRECTING AIR UPWARDLY IN AN EQUIPMENT ENCLOSURE

(75) Inventors: Richard Evans Lewis, II, Austin, TX (US); Dennis W. Vanlith, Oxnard, CA (US); Daniel Alaniz, Austin, TX (US); D. Brian Donowho, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 22 days.

(21) Appl. No.: 12/477,118

(22) Filed: Jun. 2, 2009

(65) Prior Publication Data

US 2009/0239461 A1    Sep. 24, 2009

Related U.S. Application Data

(62) Division of application No. 11/533,362, filed on Sep. 19, 2006, now Pat. No. 7,542,287.

(60) Provisional application No. 60/718,548, filed on Sep. 19, 2005.

(51) Int. Cl.
*H05K 7/20* (2006.01)

(52) U.S. Cl. ............. 361/695; 361/679.47; 361/679.49; 361/679.51; 361/724; 165/80.3; 165/104.33; 165/104.34; 454/184

(58) Field of Classification Search ............ 361/679.02, 361/679.46, 679.49, 679.51, 724–728, 831; 165/80.3, 104.33, 104.34, 104.19, 121–127, 165/185; 454/184; 312/213, 223.2, 223.3, 312/236, 223.21, 265.5

See application file for complete search history.

(56) References Cited

U.S. PATENT DOCUMENTS

| 2,201,312 | A |   | 5/1940 | Hauser |
| 2,227,587 | A |   | 1/1941 | Jones et al. |
| 2,477,315 | A |   | 7/1949 | Smith |
| 3,192,306 | A |   | 6/1965 | Skonnord |
| 3,364,838 | A | * | 1/1968 | Bradley .................. 312/213 |

(Continued)

FOREIGN PATENT DOCUMENTS

DE          2509487 A1    9/1976

(Continued)

OTHER PUBLICATIONS

Information Disclosure Statement (IDS) Letter Regarding Common Patent Application(s) dated Apr. 19, 2010.

(Continued)

*Primary Examiner* — Michael V Datskovskiy
(74) *Attorney, Agent, or Firm* — Tillman Wright, PLLC; James D. Wright; Chad D. Tillman

(57) ABSTRACT

An electronic equipment enclosure comprises a frame structure formed from a plurality of support posts and at least partially enclosed by a plurality of panels. The panels include at least side, top and back panels defining an enclosure having a top, a bottom and a rear thereof. The top panel includes an opening there through that is rectangular in shape. The equipment enclosure further comprises an exhaust air duct extending upward from the top panel of the enclosure. The exhaust air duct is rectangular in cross-section and is disposed in surrounding relation to, and in fluid communication with, the top panel opening. The exhaust air duct is adapted to segregate hot air being exhausted from the enclosure from cool air entering the enclosure, thereby improving thermal management of the enclosure.

28 Claims, 13 Drawing Sheets

U.S. PATENT DOCUMENTS

| | | | |
|---|---|---|---|
| 3,563,627 A | 2/1971 | Whipps | |
| 4,357,860 A | 11/1982 | Krzak | |
| 4,495,545 A | 1/1985 | Dufresne et al. | |
| 4,543,677 A | 10/1985 | Haglund et al. | |
| 4,648,007 A | 3/1987 | Garner | |
| 4,944,082 A * | 7/1990 | Jones et al. | 29/467 |
| 5,162,976 A * | 11/1992 | Moore et al. | 361/679.58 |
| 5,216,579 A | 6/1993 | Basara et al. | |
| 5,219,403 A | 6/1993 | Murphy | |
| 5,294,748 A | 3/1994 | Schwenk et al. | |
| 5,347,430 A * | 9/1994 | Curlee et al. | 361/816 |
| 5,460,441 A | 10/1995 | Hastings et al. | |
| 5,473,114 A | 12/1995 | Vogel et al. | |
| 5,524,104 A * | 6/1996 | Iwata et al. | 720/652 |
| 5,528,454 A | 6/1996 | Niklos | |
| 5,536,079 A | 7/1996 | Kostic | |
| 5,544,012 A * | 8/1996 | Koike | 361/695 |
| 5,570,740 A | 11/1996 | Flores et al. | |
| 5,660,212 A | 8/1997 | Elder | |
| 5,671,805 A | 9/1997 | Stahl et al. | |
| 5,851,143 A | 12/1998 | Hamid | |
| 5,865,478 A | 2/1999 | Lin | |
| 5,941,767 A | 8/1999 | Fukuda | |
| 5,995,368 A | 11/1999 | Lee et al. | |
| 5,997,117 A | 12/1999 | Krietzman | |
| 6,034,873 A | 3/2000 | Stahl et al. | |
| 6,036,290 A | 3/2000 | Jancsek et al. | |
| 6,044,193 A | 3/2000 | Szentesi et al. | |
| 6,052,277 A * | 4/2000 | Liu et al. | 361/679.31 |
| 6,067,233 A | 5/2000 | English et al. | |
| 6,075,698 A * | 6/2000 | Hogan et al. | 361/695 |
| 6,104,003 A | 8/2000 | Jones | |
| D432,098 S | 10/2000 | Nelson et al. | |
| 6,127,663 A | 10/2000 | Jones | |
| 6,163,454 A | 12/2000 | Strickler | |
| 6,185,098 B1 | 2/2001 | Benavides | |
| 6,198,628 B1 | 3/2001 | Smith | |
| 6,222,729 B1 * | 4/2001 | Yoshikawa | 361/695 |
| 6,231,704 B1 | 5/2001 | Carpinetti | |
| 6,250,727 B1 * | 6/2001 | Kan et al. | 312/223.2 |
| 6,304,438 B1 * | 10/2001 | Liu et al. | 361/727 |
| 6,333,851 B1 * | 12/2001 | Shih | 361/695 |
| 6,381,147 B1 * | 4/2002 | Hayward et al. | 361/756 |
| 6,459,579 B1 * | 10/2002 | Farmer et al. | 361/695 |
| 6,462,944 B1 | 10/2002 | Lin | |
| 6,490,156 B2 * | 12/2002 | Chen | 361/679.4 |
| 6,529,371 B1 * | 3/2003 | Laio | 361/679.6 |
| 6,554,697 B1 | 4/2003 | Koplin | |
| 6,557,357 B2 | 5/2003 | Spinazzola et al. | |
| 6,574,970 B2 | 6/2003 | Spinazzola et al. | |
| 6,592,448 B1 | 7/2003 | Williams | |
| 6,600,100 B2 * | 7/2003 | Ho et al. | 136/255 |
| 6,616,524 B2 | 9/2003 | Storck, Jr. et al. | |
| 6,646,872 B1 * | 11/2003 | Chen | 361/679.33 |
| 6,646,878 B2 * | 11/2003 | Chan | 361/695 |
| 6,652,373 B2 | 11/2003 | Sharp et al. | |
| 6,668,565 B1 | 12/2003 | Johnson et al. | |
| 6,669,552 B1 | 12/2003 | Beer | |
| 6,672,955 B2 | 1/2004 | Charron | |
| 6,745,579 B2 | 6/2004 | Spinazzola et al. | |
| 6,766,832 B2 | 7/2004 | DiMarco | |
| 6,801,427 B2 * | 10/2004 | Gan et al. | 361/679.33 |
| 6,819,563 B1 | 11/2004 | Chu et al. | |
| 6,843,277 B2 | 1/2005 | Meguro et al. | |
| 6,854,284 B2 | 2/2005 | Bash et al. | |
| 6,867,967 B2 | 3/2005 | Mok | |
| 6,912,131 B2 * | 6/2005 | Kabat | 361/720 |
| 6,957,670 B1 | 10/2005 | Kajino | |
| 7,011,576 B2 | 3/2006 | Sharp et al. | |
| 7,016,194 B1 | 3/2006 | Wong | |
| 7,033,267 B2 | 4/2006 | Rasmussen | |
| 7,112,131 B2 | 9/2006 | Rasmussen et al. | |
| 7,144,320 B2 | 12/2006 | Turek et al. | |
| 7,154,748 B2 | 12/2006 | Yamada | |
| 7,182,208 B2 | 2/2007 | Tachibana | |
| 7,212,403 B2 * | 5/2007 | Rockenfeller | 361/679.47 |
| 7,236,362 B2 | 6/2007 | Wang et al. | |
| 7,255,640 B2 | 8/2007 | Aldag et al. | |
| 7,259,961 B2 * | 8/2007 | Lucero et al. | 361/695 |
| 7,259,963 B2 | 8/2007 | Germagian et al. | |
| 7,286,345 B2 | 10/2007 | Casebolt | |
| 7,309,279 B2 * | 12/2007 | Sharp et al. | 454/184 |
| 7,349,209 B2 | 3/2008 | Campbell et al. | |
| 7,355,850 B2 * | 4/2008 | Baldwin, Jr. | 361/695 |
| 7,372,695 B2 | 5/2008 | Coglitore et al. | |
| 7,427,713 B2 | 9/2008 | Adducci et al. | |
| 7,438,124 B2 | 10/2008 | Bhatti et al. | |
| 7,438,638 B2 | 10/2008 | Lewis et al. | |
| 7,485,803 B2 | 2/2009 | Adducci et al. | |
| 7,486,512 B2 | 2/2009 | Campbell et al. | |
| 7,495,169 B2 | 2/2009 | Adducci et al. | |
| 7,500,911 B2 | 3/2009 | Johnson et al. | |
| 7,504,581 B2 | 3/2009 | Adducci et al. | |
| 7,508,663 B2 | 3/2009 | Coglitore et al. | |
| 7,542,287 B2 | 6/2009 | Lewis, II et al. | |
| 7,604,535 B2 | 10/2009 | Germagian et al. | |
| 7,752,858 B2 | 7/2010 | Johnson et al. | |
| 7,764,495 B2 | 7/2010 | Hruby et al. | |
| 7,804,685 B2 | 9/2010 | Krietzman | |
| 2002/0101721 A1 | 8/2002 | Blood | |
| 2004/0007348 A1 | 1/2004 | Stoller | |
| 2004/0050808 A1 | 3/2004 | Krampotich et al. | |
| 2004/0099747 A1 | 5/2004 | Johnson et al. | |
| 2004/0105222 A1 * | 6/2004 | Chen et al. | 361/683 |
| 2004/0182799 A1 | 9/2004 | Tachibana | |
| 2004/0190270 A1 | 9/2004 | Aldag et al. | |
| 2004/0201333 A1 * | 10/2004 | Chen | 312/223.2 |
| 2005/0153649 A1 | 7/2005 | Bettridge et al. | |
| 2005/0170770 A1 | 8/2005 | Johnson et al. | |
| 2005/0225936 A1 | 10/2005 | Day | |
| 2005/0237716 A1 | 10/2005 | Chu et al. | |
| 2005/0286223 A1 * | 12/2005 | Morales | 361/690 |
| 2006/0141921 A1 | 6/2006 | Turek et al. | |
| 2006/0213498 A1 | 9/2006 | Sellwood | |
| 2006/0276121 A1 | 12/2006 | Rasmussen | |
| 2007/0025073 A1 * | 2/2007 | Liu | 361/685 |
| 2007/0064389 A1 | 3/2007 | Lewis, II | |
| 2007/0064391 A1 | 3/2007 | Lewis et al. | |
| 2007/0171610 A1 | 7/2007 | Lewis | |
| 2007/0173189 A1 | 7/2007 | Lewis | |
| 2007/0183129 A1 | 8/2007 | Lewis et al. | |
| 2007/0210679 A1 | 9/2007 | Adducci et al. | |
| 2007/0210680 A1 | 9/2007 | Appino et al. | |
| 2007/0210681 A1 | 9/2007 | Adducci et al. | |
| 2007/0210683 A1 | 9/2007 | Adducci et al. | |
| 2007/0210686 A1 | 9/2007 | Adducci et al. | |
| 2007/0221393 A1 | 9/2007 | Adducci et al. | |
| 2008/0068791 A1 | 3/2008 | Ebermann | |
| 2008/0174217 A1 | 7/2008 | Walker | |
| 2008/0266789 A1 | 10/2008 | Hruby et al. | |
| 2009/0061755 A1 | 3/2009 | Calder et al. | |
| 2009/0190307 A1 | 7/2009 | Krietzman | |
| 2009/0239460 A1 | 9/2009 | Lucia et al. | |
| 2010/0061059 A1 | 3/2010 | Krietzman et al. | |
| 2010/0172092 A1 | 7/2010 | Davis et al. | |
| 2010/0172093 A1 | 7/2010 | Davis et al. | |

FOREIGN PATENT DOCUMENTS

| | | |
|---|---|---|
| EP | 2205054 A1 | 7/2010 |
| GB | 2354066 A * | 3/2001 |
| JP | 2000193792 A | 7/2000 |
| JP | 02000286580 A | 10/2000 |
| JP | 2003056993 A | 2/2003 |
| JP | 2004200594 A | 7/2004 |
| JP | 2004252758 A | 9/2004 |
| JP | 2007212092 A | 8/2007 |
| WO | 2009089008 A2 | 7/2009 |
| WO | 2009103090 A2 | 8/2009 |
| WO | 2009103090 A3 | 10/2009 |
| WO | 2010028384 A2 | 3/2010 |

OTHER PUBLICATIONS

"International Search Report" and "Written Opinion of the International Searching Authority" (ISA/US Korean Intellectual Propery Office) in Chatsworth Products, Inc. et al., International Patent Application Serial No. PCT/US2009/056256, Applicant's file reference 3001.214, International Filing Date Sep. 8, 2009, Mailed on Apr. 7, 2010, Completed on Apr. 6, 2010, 7 pages.

"International Search Report" and "Written Opinion" of the International Search Authority (Korean Intellectual Property Office) in Chatsworth Products, Inc. et al., International Patent Application Serial No. PCT/US2009/034338, filed Feb. 17, 2009 mailed on Sep. 1, 2009 and completed on Aug. 31, 2009, 7 pages.

Information Disclosure Statement (IDS) Letter Regarding Common Patent Application(s), dated Nov. 3, 2009.

Information Disclosure Statement (IDS) Letter Regarding Common Patent Application(s), submitted by Applicant on Sep. 22, 2009.

Information Disclosure Statement (IDS) Letter Regarding Common Patent Application(s), dated Jan. 7, 2010.

Information Disclosure Statement (IDS) Letter Regarding Common Patent Application(s), dated Aug. 12, 2010.

Rasmussen, Neil, "White Paper #55" Brochure, "Air Distribution Architecture Options for Mission Critical Facilities" by American Power Conversion (APC), 2003, Rev. 1: 2003-0, 13 pages, www.apc.com.

Chatsworth Products, Inc., "Thermal Management Solutions", Signature Solutions Brochure, Revision dated Mar. 2008, 6 pages, www.chatsworth.com/passivecooling.

* cited by examiner

AIR DIVERTER FOR DIRECTING AIR UPWARDLY IN AN EQUIPMENT ENCLOSURE

CROSS-REFERENCE TO RELATED APPLICATION

The present application claims the benefit under 35 U.S.C. §120 to, and is a divisional of, U.S. patent application Ser. No. 11/533,362 filed Sep. 19, 2006, now U.S. Pat. No. 7,542,287, which '362 application is a U.S. nonprovisional patent application of, and claims priority under 35 U.S.C. §119(e) to, U.S. Provisional Patent Application No. 60/718,548, filed Sep. 19, 2005. Each of the foregoing U.S. patent applications and U.S. patents from which priority is claimed is hereby incorporated herein by reference.

Additionally, the present application hereby incorporates herein by reference each of the following U.S. patent application publications: 20070064391 titled AIR DIVERTER FOR DIRECTING AIR UPWARDLY IN AN EQUIPMENT ENCLOSURE; and 2007-0064389 titled DUCTED EXHAUST EQUIPMENT ENCLOSURE.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

1. Field of the Present Invention

The present invention relates generally to cabinets for rack-mount computer and data storage equipment, and, in particular, to thermal management of cabinets for rack-mount computer and data storage equipment.

2. Background

Racks, frames and cabinets for mounting and storing computer and other electronic components or equipment have been well known for many years. Racks and frames are typically simple rectangular frameworks on which electronic components may be mounted, or on which other mounting members, such as shelves or brackets, may be mounted which in turn may support the electronic components. Cabinets are typically frames on which panels or doors, or both, are hung to provide aesthetic improvement, to protect the components from external influences, to provide security for the components stored inside, or for other reasons.

Racks, frames and cabinets have been built in many different sizes and with many different proportions in order to best accommodate the components which they are designed to store. Components stored in these enclosures may include audio and video equipment and the like, but quite frequently include computer equipment and related peripheral devices. These components typically include housings enclosing internal operative elements.

As is also well known, the electronic equipment mounted therein tends to generate large amounts of thermal energy that needs to be exhausted away from the equipment effectively in order to maintain the equipment in proper operating order or to prevent damage thereto. The problem can be especially significant when the components are enclosed in cabinets, because thermal energy generated thereby can concentrate within the equipment enclosure and cause the components to overheat and shut down. As equipment becomes more densely packed with electronics, the quantities of thermal energy have continued to increase in recent years, and thermal energy management has become a significant issue confronting today's rack, cabinet, frame and enclosure manufacturers, the manufacturers of the electronic equipment, and the users of such equipment.

Typically, multiple racks, frames, cabinets, and the like (sometimes collectively referred to hereinafter as "enclosures") are housed together in a data center. Because of the overheating problem and particularly with multiple enclosures being placed in a single room or other enclosed space, thermal management of the data center is very important. A goal of data center thermal management is to maximize the performance, uptime and life expectancy of the active components being housed in the data center. This goal is generally accomplished by managing the cold air delivered to each component such that the internal temperature of the component does not exceed the manufacturer's maximum allowable operating temperature. Preferably, the cold air delivered to the component is at or below the manufacturer's recommended temperature and in sufficient volume to meet the airflow requirements of the component, which are typically measured in cubic feet per minute (CFM).

A common type of operating environment for enclosures and the equipment mounted therein is known as a "raised floor" system, wherein the enclosures are supported on a heavy-duty mechanical floor that is installed above the actual floor of the room at a given elevation. One significant advantage of this approach is that cables, wires, water pipes, and other utility connections may be routed to and from the enclosures via the space beneath the floor, thereby leaving the top surface of the raised floor clear for locating enclosures and traversal by users. Another significant advantage, however, is that the space beneath the top surface of the raised floor serves as a plenum through which cool air may likewise be distributed to the enclosures. Through open tiles or perforations or ventilations in the tiles comprising the surface of the raised floor, this cool air may be supplied to the enclosures and used to cool the equipment inside.

Unfortunately, the use of perforated floor tiles, typically located directly in front of enclosures to try to cause a maximum amount of cool air to be directed into the enclosures and not merely lost to the ambient room, have been found to be insufficient in cooling the equipment within the enclosures to the desired degree. Thus, a number of techniques and devices have been developed in recent years to more efficiently utilize the capabilities of the Computer Room Air Conditioner ("CRAC") and to put the available cool air to the most efficient use possible. Among others, these include improved strategies involving perforated panels, such as those described in the commonly-assigned U.S. Provisional Patent Application No. 60/725,511, filed Oct. 10, 2005 and entitled "EFFICIENT USE OF PERFORATED PANELS IN ELECTRONIC EQUIPMENT CABINETS," and also improved cool air distribution strategies, such as those described in the commonly-assigned U.S. Provisional Patent Application No. 60/743,148, filed Jan. 20, 2006 and entitled "INTERNAL AIR DUCT," the entirety of each of which is incorporated herein by reference.

The supply of cool air to the raised floor plenum, and the transfer of thermal energy from the electronic equipment, is conventionally handled by the CRAC. Airflow through the plenum and into the enclosures generally relies solely or at least primarily on the air pressure differential as measured between the raised floor plenum and the ambient room. However, active means are often used to push or pull heated air out of the enclosures.

For a particular component, thermal energy is transferred from its housing using forced air convection. More specifically, internal fans draw or push air through the housing from front-to-rear over the heated internal elements within the housing. The air absorbs the thermal energy from the internal elements and carries it away as it exits the housing.

Airflow through a particular component housing is primarily controlled by the internal fan installed by the manufacturer. While it is possible to reduce this throughput by constricting air flow through an enclosure, it is difficult to appreciably increase the airflow through a component housing.

In addition, the rate of transfer of thermal energy from the housing does not change very much for different intake air temperatures. Lowering the intake air temperature reduces the temperature of the processor(s) inside of the component, but the temperature change and the total cooling taking place for the component does not change for a constant airflow. Therefore, any enclosure that does not choke the airflow through the component mounted inside and that prevents recirculation should effectively dissipate most, if not all, of the thermal energy generated by the component.

Recent conventional thinking for the thermal management of data centers involves the use of an approach commonly referred to as the Hot Aisle/Cold Aisle approach. In this strategy, cold air aisles are segregated from hot air aisles by enclosures being positioned between them such that cold air aisles are in front of rows of enclosures and hot air aisles are behind these rows of enclosures. In this approach, the cold air and hot air aisles alternate. Ideally, air enters the enclosure from the cold air aisles and is exhausted from the enclosure into the hot air aisles.

This approach works well in low to medium density data center applications. However, it does not perform well in many medium density applications and can not support high density applications without extreme discipline and additional air flow management devices outside of the enclosures to prevent hot exhaust recirculation into the cold aisle.

Further, Hot Aisle/Cold Aisle data center environments typically do not operate at ideal conditions. Two common problems that affect thermal management in general, and Hot Aisle/Cold Aisle in particular, are recirculation and bypass. Recirculation occurs when hot exhaust air travels back into the component intake air stream. Recirculation can occur for a single component or for an entire enclosure. When this occurs, the exhaust airflow raises intake air temperatures and causes components to run at higher operating temperatures. Bypass occurs when cold source air bypasses the active component and travels directly into the hot exhaust air stream. Similarly to recirculation, bypass may occur for a single component or for a whole enclosure. Because cold source air is bypassing the active component, the air is not serving its intended purpose of transferring thermal energy away from the active component. As such, the bypassing air is essentially wasted, and the active component retains its thermal energy until additional cold source air contacts the active component thereby transferring the thermal energy away from the component. Based on the foregoing, it is readily apparent that bypass wastes energy. In addition, bypass contributes to humidity control problems, and can indirectly contribute to recirculation. Under ideal circumstances, all recirculation and bypass airflow can be eliminated.

Hot Aisle/Cold Aisle is a well-principled thermal management approach, i.e., segregating the cold source air in front of enclosures and hot exhaust air behind them does work. Unfortunately, maintaining the segregation is difficult. In order to maintain proper segregation, the airflow delivered to each enclosure must roughly equal the airflow required by all of the active components in each enclosure. In addition, strict discipline and careful airflow balancing are required to maintain this ideal operating condition in higher density data center environments. While an initial installation may realize these ideal conditions, moves, adds and changes, along with the demands for constantly monitoring and rebalancing, frequently make maintaining this ideal operating condition impractical, if not outright impossible.

For example, one known airflow balancing technique employs variable speed fans that are carefully monitored and controlled using appropriate control methodologies. A drawback to the controlled variable speed fan approach is the unpredictable nature of components, particularly server usage. For example if a server is suddenly heavily burdened by a particular software application, the server heats up, perhaps more quickly than expected, or more than can be handled quickly by a corresponding variable fan. The fan then quickly increases in speed in an attempt to respond to the sudden drastic increase in temperature of the server. The fan may not be able to sufficiently supply cooling air to the suddenly overheated server, and even if it is, such heat balancing procedure is difficult, at best, to manage. It would be better to avoid dependence on such a reactive approach to thermal management.

Cylindrical exhaust ducts have been added to enclosures in an effort to alleviate thermal management issues such as recirculation and bypass. The exhaust ducts generally extend upwardly away from a top surface of the enclosure near the rear of the enclosure and provide a path for hot exhaust air to be expelled. While available exhaust ducts are operative for their intended purpose, an improved design thereof would further aid in alleviating thermal management issues. In addition, it has been found that heated air tends to pool or collect in portions of the interior of enclosures rather than be guided to the exhaust ducts.

As such, a need exists for an improved design of exhaust ducts for component storage enclosures. Further, additional thermal management features are needed in these enclosures. This, and other needs, are addressed by one or more aspects of the present invention.

SUMMARY OF THE PRESENT INVENTION

The present invention includes many aspects and features. Moreover, while many aspects and features relate to, and are described in, the context of enclosures for storage of electronic equipment, the present invention is not limited to use only in enclosures for storage of electronic equipment, as will become apparent from the following summaries and detailed descriptions of aspects, features, and one or more embodiments of the present invention.

Broadly defined, the present invention according to one aspect includes an electronic equipment enclosure comprising a frame structure formed from a plurality of support posts and at least partially enclosed by a plurality of panels. The panels include at least side, top and back panels defining an enclosure having a top, a bottom and a rear thereof. The top panel includes an opening there through that is rectangular in shape. The equipment enclosure further comprises an exhaust air duct extending upward from the top panel of the enclosure. The exhaust air duct is rectangular in cross-section and is disposed in surrounding relation to, and in fluid communication with, the top panel opening. The exhaust air duct is adapted to segregate hot air being exhausted from the enclosure from cool air entering the enclosure, thereby improving thermal management of the enclosure.

In a feature of this aspect, the top panel opening is disposed toward the rear of the top panel. In accordance with this feature, the top panel opening is disposed substantially adjacent the back panel of the enclosure. With regard to this feature, the dimensions of the rectangular cross-section of the exhaust air duct are substantially similar to the dimensions of the top panel opening.

In another feature, the top panel opening is disposed toward the rear of the enclosure. In an additional feature, the exhaust air duct is self-supporting. In yet another feature, the exhaust air duct is adapted to be connected to a separate overhead structure in a room. With regard to this feature, the exhaust air duct is adapted to be connected to a return air duct. With further regard to this feature, the exhaust air duct has a top edge and a mounting flange extending around the periphery of the top edge for connection to a separate overhead structure in a room.

In yet another feature, the height of the exhaust air duct is adjustable, thereby adjusting the distance to which the exhaust air duct extends above the top panel of the enclosure. With regard to this feature, the exhaust air duct includes a first rectangular open-ended duct section that nests inside a second rectangular open-ended duct section, wherein the first duct section may be telescopically withdrawn from the second duct section.

In a further feature, the back panel is generally air-impervious to prevent heated air from escaping there through. In accordance with this feature, the back panel is a door panel that is connected at a connection point to the frame structure. Seals are disposed at the connection point between the back door panel and the frame structure. In furtherance of this feature, the seals are brackets. With regard to this feature, the seals are metal. It is preferred that rubber or foam gaskets are included with the seals.

In an additional feature, the plurality of panels includes a bottom panel that has a brush opening arranged therein.

Broadly defined, the present invention according to another aspect includes an electronic equipment enclosure comprising a frame structure formed from a plurality of support posts and at least partially enclosed by a plurality of panels. The panels include at least side, top and back panels defining an enclosure having a top, a bottom and a rear thereof. The top panel includes an opening there through. The equipment enclosure further comprises an exhaust air duct extending upward from the top panel of the enclosure. The exhaust air duct is disposed in generally surrounding relation to, and in fluid communication with, the top panel opening. The enclosure further comprises an air diverter, disposed near the rear of the enclosure and angled upward to redirect, toward the top of the enclosure, heated air moving rearward through the enclosure. The exhaust air duct and the air diverter cooperate to segregate hot air being exhausted from the enclosure from cool air entering the enclosure, thereby improving thermal management of the enclosure.

In a feature of this aspect, the top panel opening is rectangular in shape. In another feature, the top panel opening is disposed toward the rear of the top panel. In an additional feature, the top panel opening is disposed substantially adjacent the back panel of the enclosure. In accordance with this feature, the exhaust air duct is rectangular in cross-section, and the dimensions of the rectangular cross-section of the exhaust air duct are substantially similar to the dimensions of the top panel opening.

In yet another feature, the top panel opening is disposed toward the rear of the enclosure. In a further feature, the exhaust air duct is self-supporting. In still a further feature, the exhaust air duct is adapted to be connected to a separate overhead structure in a room. In accordance with this feature, the exhaust air duct is adapted to be connected to a return air duct. With further regard to this feature, the exhaust air duct has a top edge and a mounting flange extending around the periphery of the top edge for connection to a separate overhead structure in a room.

In an additional feature, the height of the exhaust air duct is adjustable, thereby adjusting the distance to which the exhaust air duct extends above the top panel of the enclosure. In furtherance of this feature, the exhaust air duct includes a first rectangular open-ended duct section that nests inside a second rectangular open-ended duct section, wherein the first duct section may be withdrawn from the second duct section by a predetermined amount.

In another feature, the back panel is generally air-impervious to prevent heated air from escaping there through. With regard to this feature, the back panel is a door panel that is connected at a connection point to the frame structure. Seals are disposed at the connection point between the back door panel and the frame structure. With further regard to this feature, the seals are brackets. It is preferred that the seals are metal. It is further preferred that rubber or foam gaskets are included with the seals.

In still yet another feature, the plurality of panels includes a bottom panel that has a brush opening arranged therein.

Broadly defined, the present invention according to yet another aspect includes an exhaust air duct adapted to segregate hot air being exhausted from an electronic equipment enclosure from cool air entering the enclosure, thereby improving thermal management of the enclosure, wherein the exhaust air duct includes four panels joined at side edges thereof to form a rectangular shaped exhaust duct. Each of at least two of the panels has a flange at a bottom edge thereof such that the exhaust air duct has a flange around a bottom periphery thereof.

In a feature of this aspect, each of all four of the panels has a flange at a bottom edge such that the exhaust air duct has a flange around a bottom periphery thereof. In another feature, the panels are constructed of a material that is self-supporting. In yet another feature, an upper end thereof is adapted to be connected to a separate overhead structure in a room. In accordance with this feature, the upper end thereof is adapted to be connected to a return air duct. With regard to this feature, the upper end thereof has a top edge and a mounting flange extending around the periphery of the top edge for connection to a separate overhead structure in a room.

In an additional feature, the height of the exhaust air duct is adjustable, thereby adjusting the distance to which the exhaust air duct extends above the top panel of the enclosure. With regard to this feature, the exhaust air duct includes a first rectangular open-ended duct section that nests inside a second rectangular open-ended duct section, wherein the first duct section may be telescopically withdrawn from the second duct section. In accordance with this feature, the telescopically withdrawn duct section is self-supporting. Further in accordance with this feature, the telescopically withdrawn duct section may be affixed to the second duct section at a user-controlled vertical disposition relative to the second duct section. It is preferred that at least one of the duct sections includes a plurality of columns of evenly-spaced openings adapted to facilitate the connection of the two duct sections together to effectuate the user-controlled vertical disposition.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
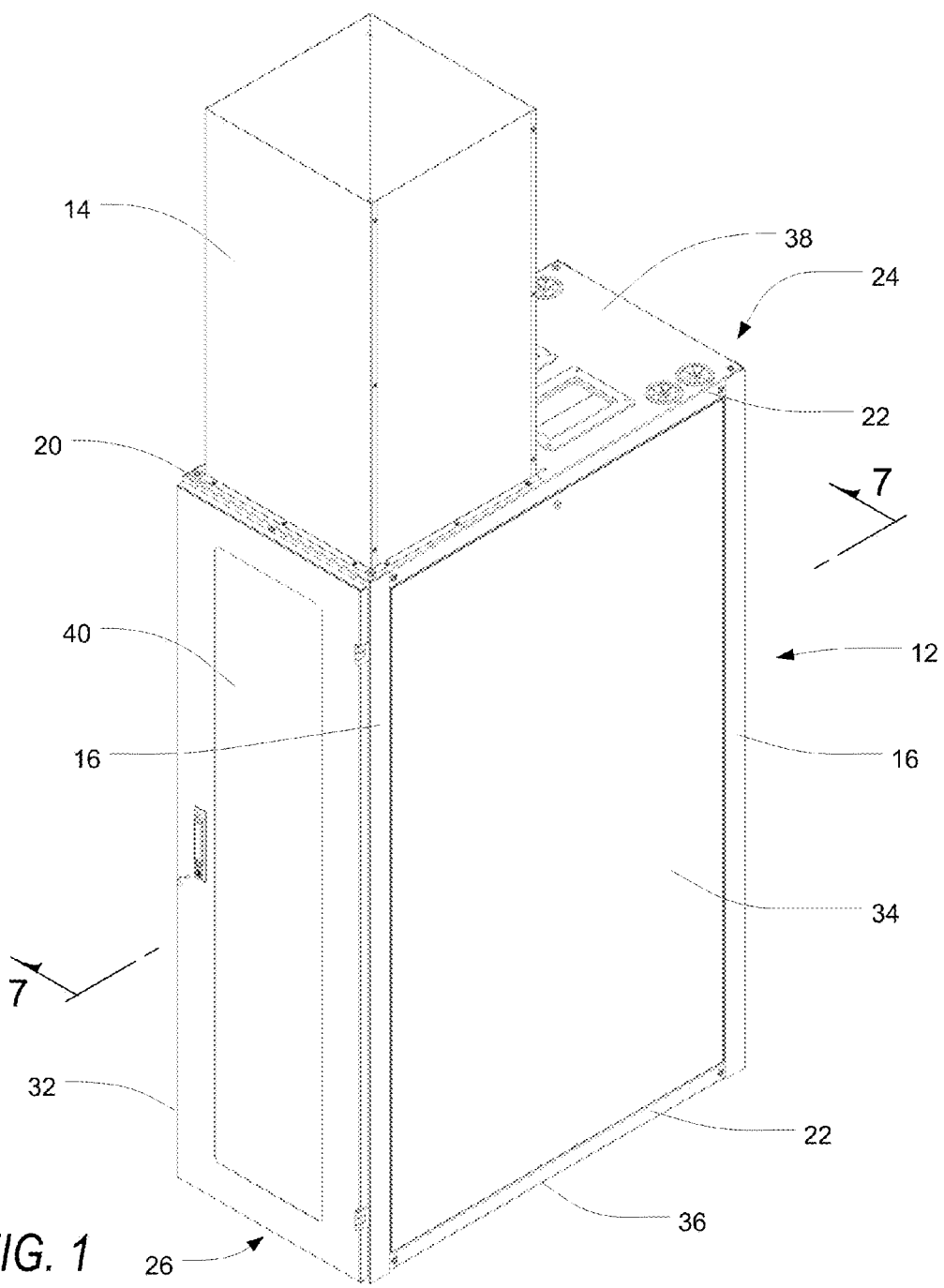
FIG. 1 is a rear isometric view of a ducted exhaust equipment enclosure in accordance with a preferred embodiment of the present invention.
Figure 2:
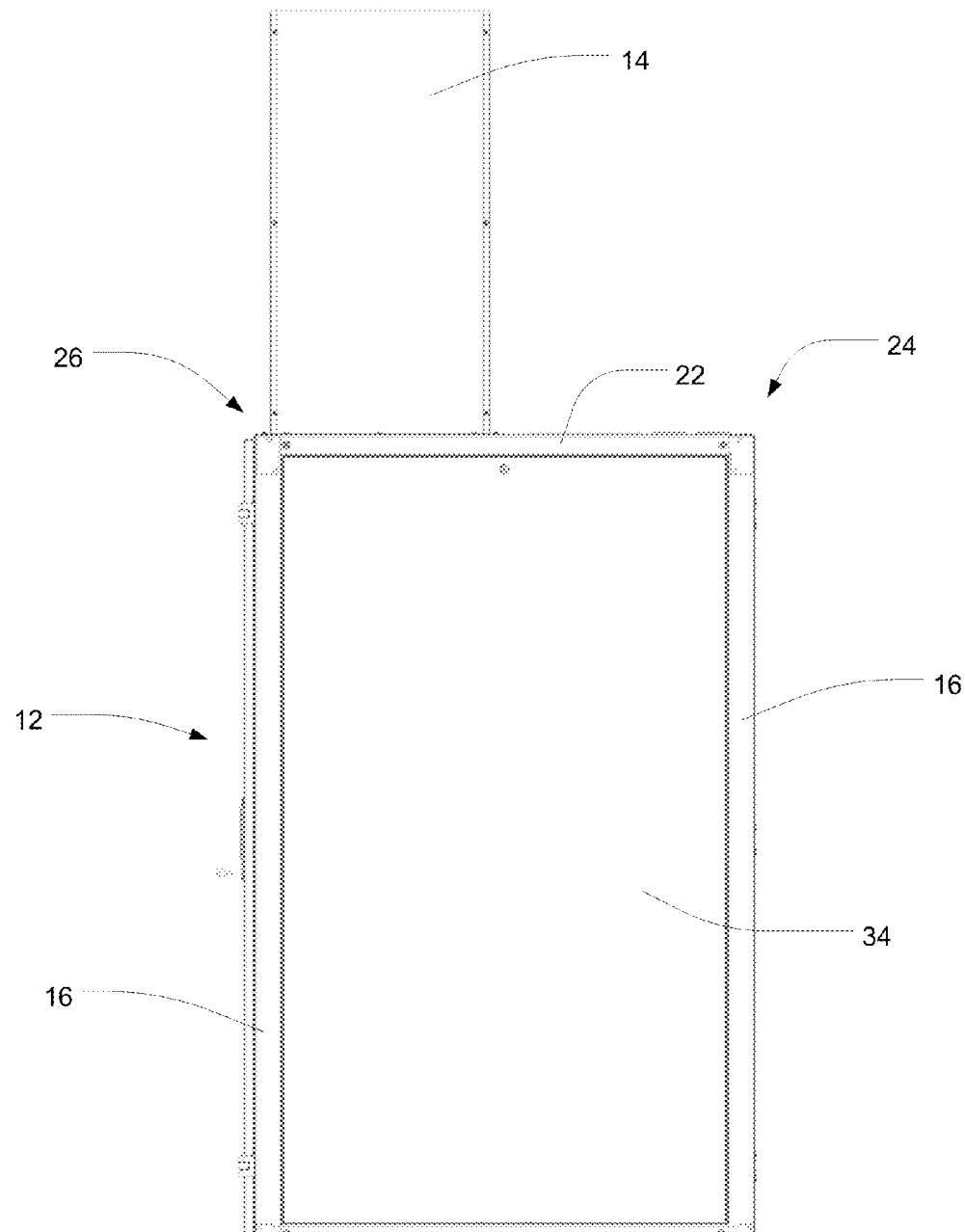
FIG. 2 is a left plan view of the ducted exhaust equipment enclosure of FIG. 1.
Figure 3:
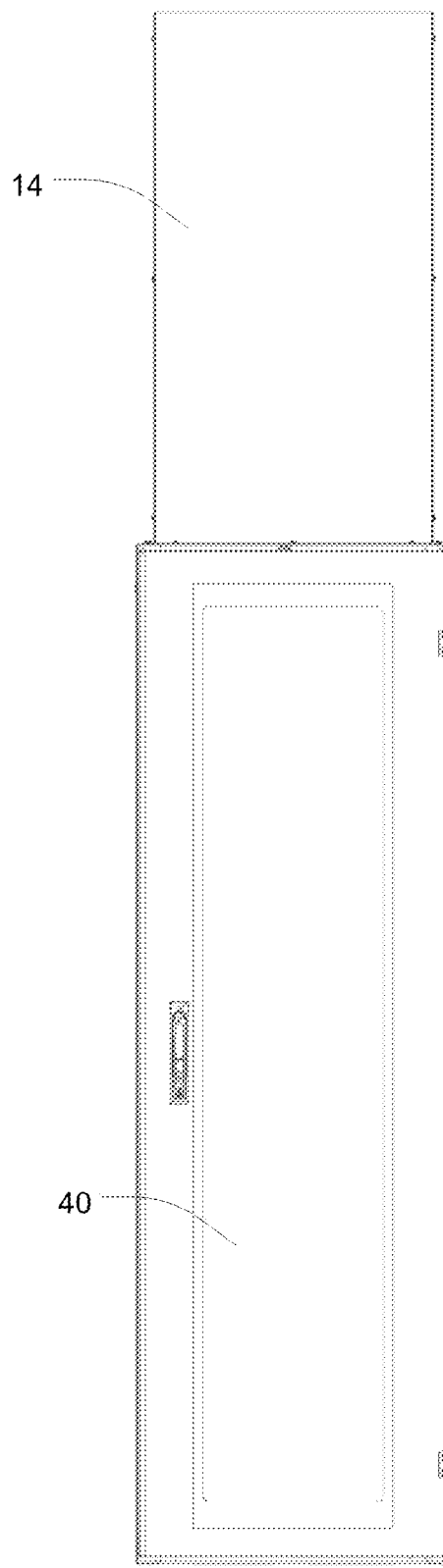
FIG. 3 is a rear plan view of the ducted exhaust equipment enclosure of FIG. 1.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

FIGS. 1-6 are various views of a ducted exhaust equipment enclosure 10 in accordance with a preferred embodiment of the present invention. More particularly, FIG. 1 is a rear isometric view of such a ducted exhaust equipment enclosure 10, and FIGS. 2-6 are a left plan view, rear plan view, front plan view, top plan view and bottom plan view, respectively, of the ducted exhaust equipment enclosure of FIG. 1. As shown therein, the ducted exhaust equipment enclosure 10 includes a four post frame structure 12 having panels 32,34, 36,38,40, more fully described hereinbelow, partially enclosing the enclosure 10, attached thereto and an exhaust air duct 14 extending upwardly from the top of the enclosure 10.

The four post frame structure 12 may be of conventional design and construction. As shown and described, the four post frame structure 12 includes four vertical support posts 16, upper and lower front cross members 18, upper and lower rear cross members 20 and two pairs of upper and lower side cross members 22. Each vertical support post 16 includes a plurality of cross member attachment apertures at each end. Two of the vertical support posts 16 are connected together at their upper and lower ends by the upper and lower front cross members 18, respectively, and the other two support posts 16 are connected together at their upper and lower ends by the upper and lower rear cross members 20, respectively. The front cross members 18 and their respective support posts 16 thus define a front frame 24, and the rear cross members 20 and their respective support posts 16 define a rear frame 26. The front and rear frames 24,26 may then be connected together at their respective corners by the upper and lower side cross members 22.

Any known connection means may be used to join the various members together. One example of such a connection means is illustrated in FIGS. 1-6. Although not illustrated herein, at least one other example of conventional connection means is described in commonly-assigned U.S. Pat. No. 6,185,098, the entirety of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

It will be evident to the Ordinary Artisan that other structures may be used to form a frame structure on which panels may be mounted to form an enclosure. For example, in at least one embodiment (not illustrated), a frame structure may be formed from only two support posts.

Figure 7:
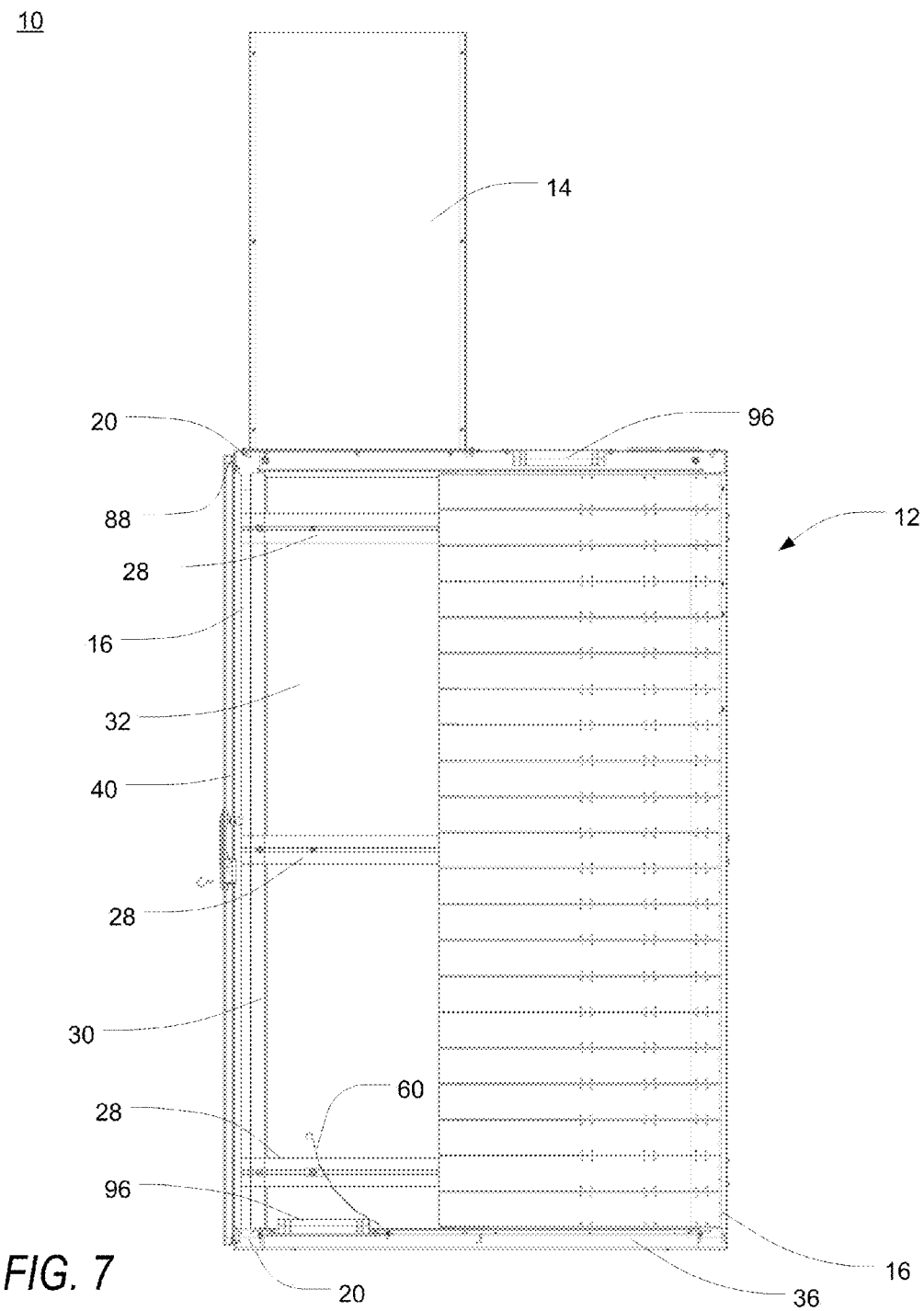
FIG. 7 is a left side cross-sectional view of the ducted exhaust equipment enclosure of FIG. 1, taken along the line 7-7.

FIG. 7 is a left side cross-sectional view of the ducted exhaust equipment enclosure 10 of FIG. 1, taken along the line 7-7. As perhaps best seen in FIG. 7, the four post frame structure 12 further comprises three pairs of horizontal mounting rails 28. Each horizontal mounting rail 28 includes a slot running substantially its entire length. In addition, three pairs of vertical mounting rails 30 are mounted to the horizontal mounting rails 28 using suitable fasteners held in place in the slots of the horizontal mounting rails 28. Each vertical mounting rail 30 preferably includes a series of threaded mounting apertures, arranged in evenly-spaced sets, extending along substantially its entire length for use in mounting electronic components, peripheral devices, cable brackets, additional mounting members, or the like thereto. It is contemplated that the number of horizontal and vertical mounting rails is variable. For example, an enclosure may include two horizontal mounting rails and two vertical mounting rails. Further, although the number of horizontal mounting rails is equal to the number of vertical mounting rails in the two examples mentioned herein, it is not necessary that the number of mounting rails be equal. It is further contemplated that, alternatively, each horizontal mounting rail may include one or more rows of mounting apertures extending along its length.

Figure 4:
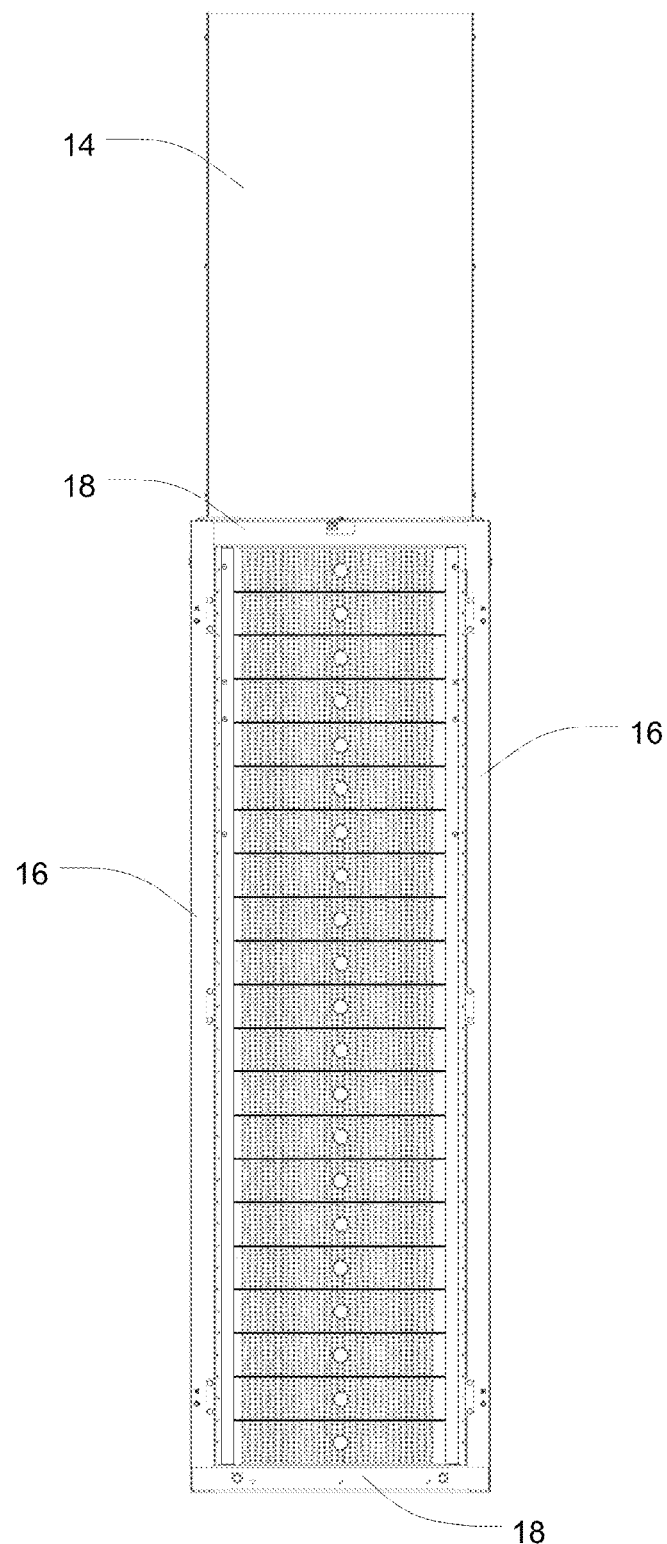
FIG. 4 is a front plan view of the ducted exhaust equipment enclosure of FIG. 1.
Figure 6:
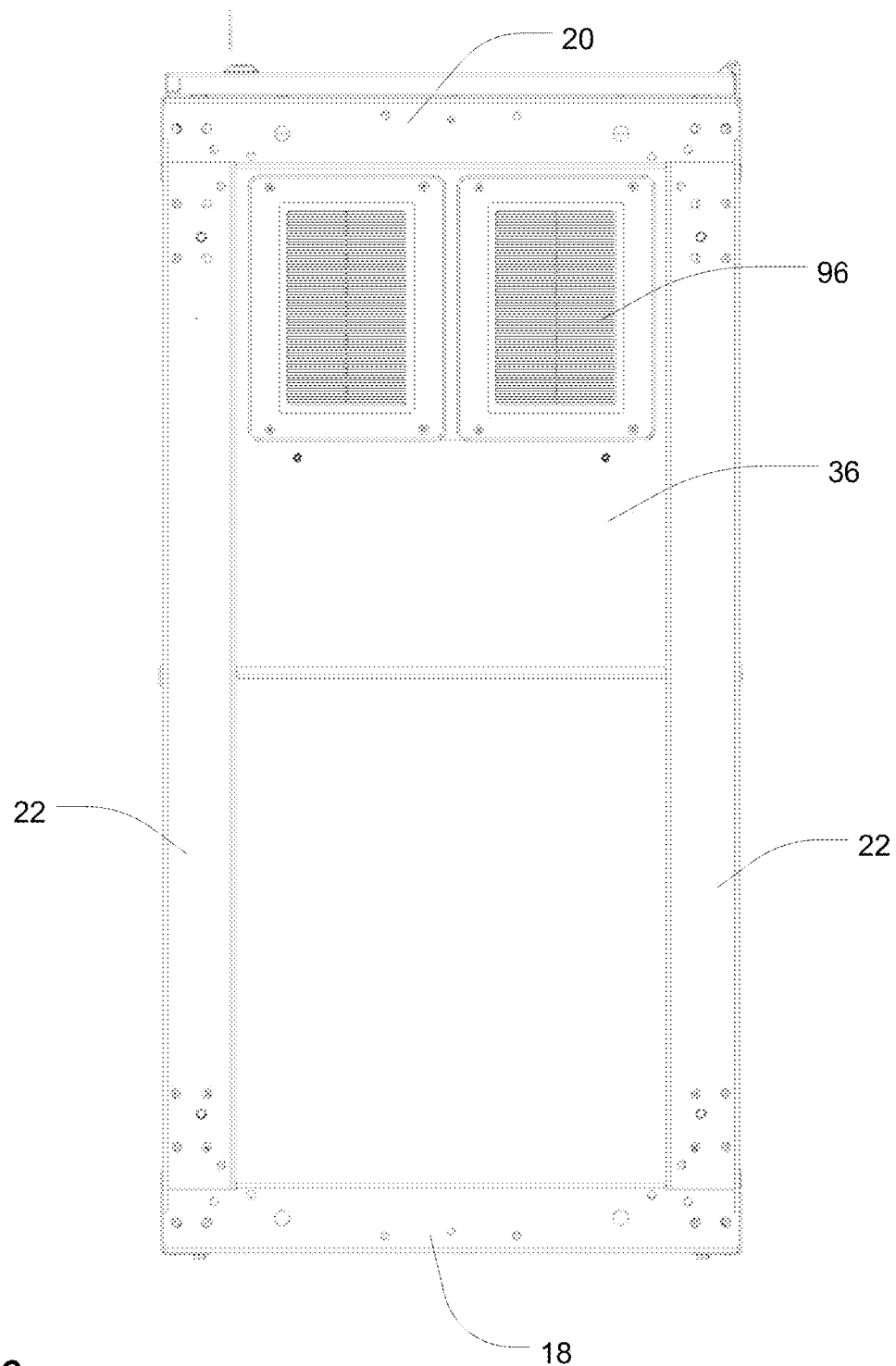
FIG. 6 is a bottom plan view of the ducted exhaust equipment enclosure of FIG. 1.

With particular reference to FIGS. 1 and 6, the enclosure 10 includes a right panel 32, a left panel 34, a bottom panel 36, a top panel 38 and a back panel 40, all attached to the frame structure 12, which partially enclose the enclosure 10. The right and left panels 32,34 are similarly dimensioned and the bottom and top panels 36,38 are similarly dimensioned, though differently constructed. As is shown in FIG. 4, a front of the enclosure 10 is open, therefore, the enclosure 10 is not completely enclosed. In a contemplated variation, the enclosure 10 may include a perforated or ventilated front panel (not illustrated). The Ordinary Artisan will understand that either variation of a front panel is operative to provide a path for air to enter the enclosure 10 for cooling the components contained therein. Further, although in the illustrated arrangement the back panel 40 is, in fact, a lockable door, it will be evident to the Ordinary Artisan that alternatively other types of doors and panels may be substituted for the various panels, and that one or more of the illustrated panels (such as one or both side panels 32,34) may in some cases be omitted altogether (such as in a row of two or more adjoining enclosures 10). It is, however, preferred that the back panel be solid, i.e., substantially air impervious, so that heated air is prevented from escaping through the door as further described hereinbelow. Any known connection means may be used to join the panels to the frame structure 12, including the back door panel 40.

Figure 5:
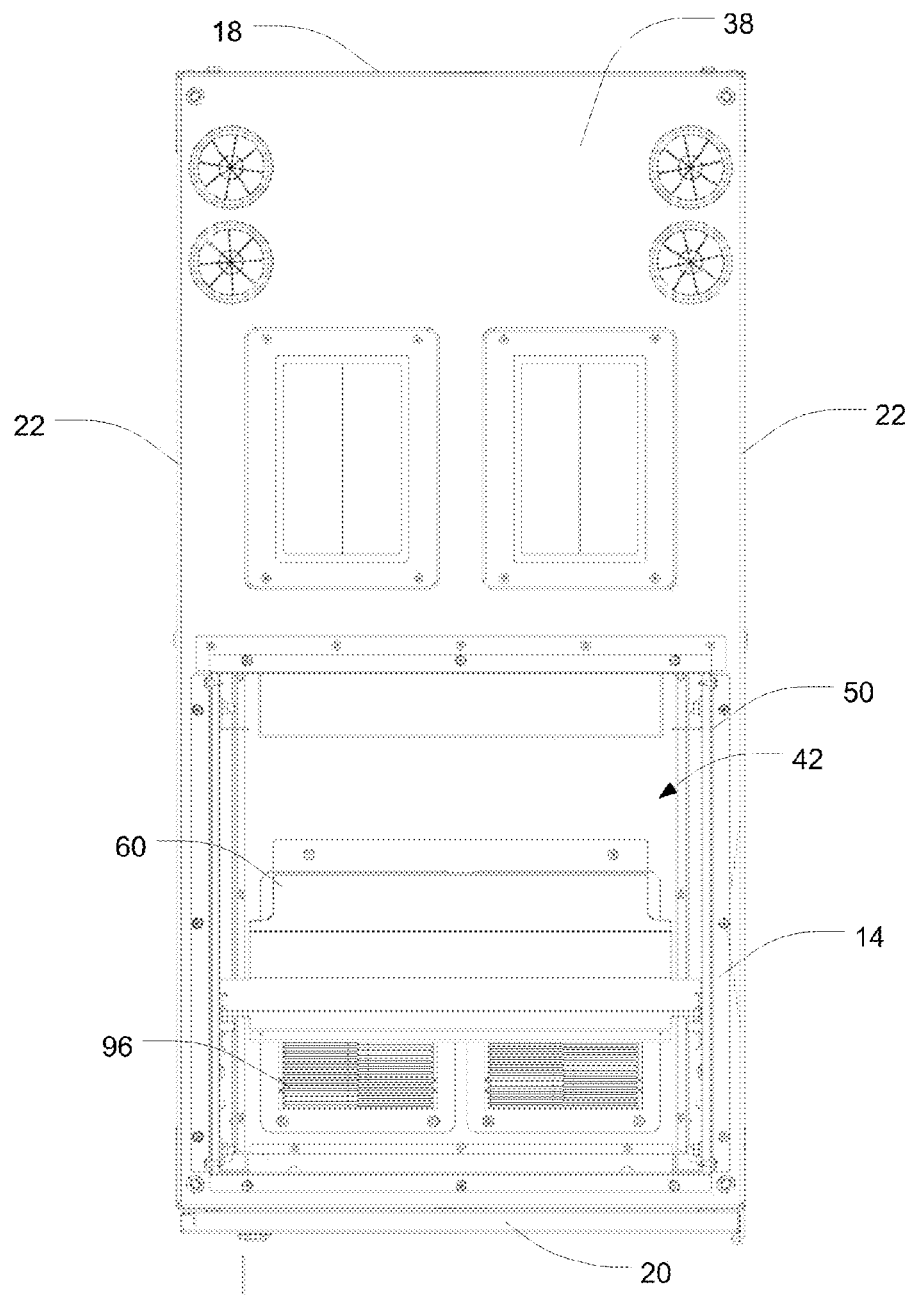
FIG. 5 is a top plan view of the ducted exhaust equipment enclosure of FIG. 1.

With reference to FIG. 5, the top panel 38 of the enclosure 10 includes a rectangular shaped opening 42 disposed adjacent the rear of the enclosure 10. The opening 42 is an exhaust opening and is intended to provided an outlet for air being exhausted from the enclosure 10, as further described hereinbelow.

Figure 8:
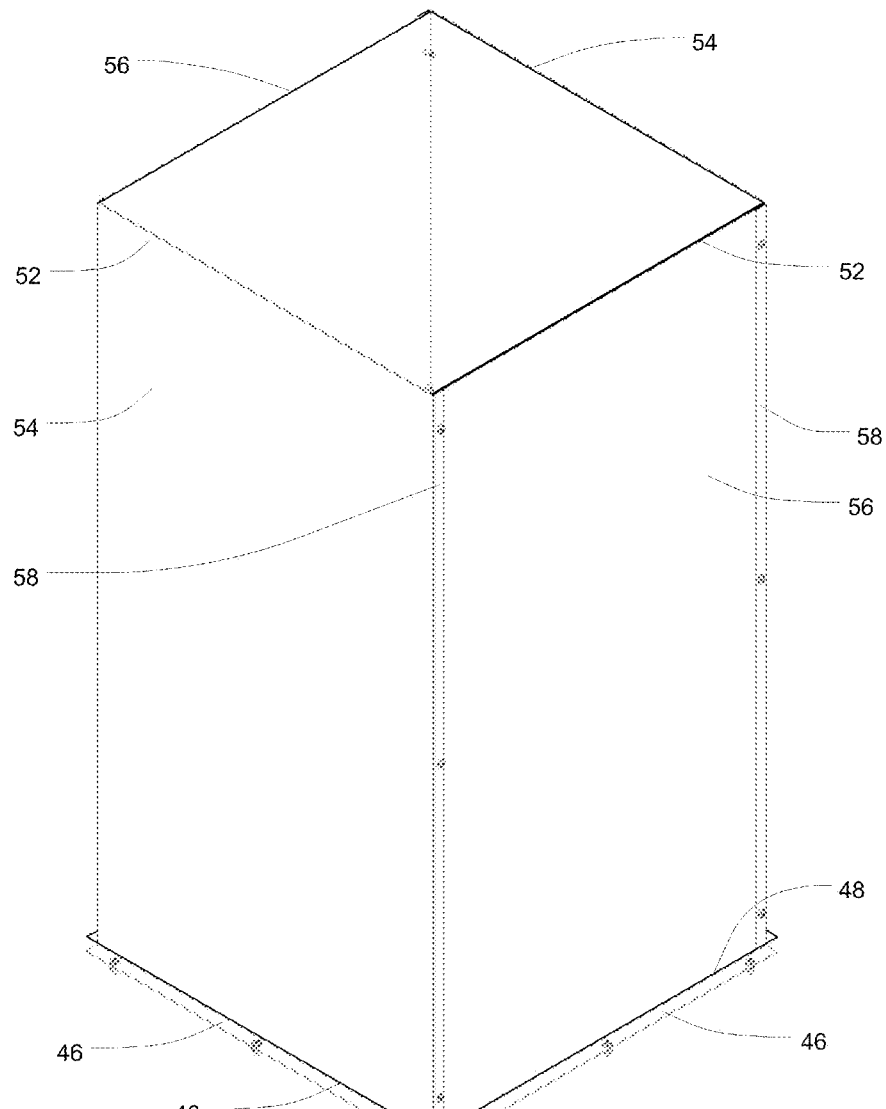
FIG. 8 is an isometric view of the exhaust air duct of FIG. 1.

As perhaps best seen in FIG. 1, the opening 42 of the top panel 38 is surrounded by, and in fluid communication with, the exhaust air duct 14. FIG. 8 is an isometric view of the exhaust air duct 14 of FIG. 1. The exhaust air duct 14 is generally rectangular in cross-section and has four generally planar panels 54,56 of substantially similar length forming a body thereof. The width of the front and rear panels 54 is selected to correspond to the width of the enclosure 10, with the width being as wide as possible and still be mountable to the top of the enclosure 10. The width of the side panels 56 of the exhaust air duct 14 are dependent on the length or depth of the enclosure 10 and in some cases the distance between the rear of equipment mounted inside and the rear of the enclosure 10. The panels 54,56 are preferably constructed of a smooth, stiff material providing a low-restriction exhaust air duct 14 that is self-supporting. Examples include, but are not limited to, aluminum or steel of a sufficient gauge to permit self-support. Significantly, unlike corrugated air ducts, the smooth nature of the material provides a surface that encourages, rather than hinders air flow. The exhaust air duct 14 is open at a bottom and top thereof to allow for unencumbered air passage there through. The rectangular cross-section and large size of the exhaust air duct 14 provides for a considerably larger cross-section than that of conventional cylindrical exhaust air ducts, and thus much greater flow-through. Further, the cross-section of the exhaust air duct 14 is therefore substantially the same as that of the top panel opening 42 to allow air to flow from the top panel opening 42 through the exhaust air duct 14 without encountering any obstruction. The exhaust air duct 14 segregates the hot exhaust air from cool air entering the enclosure 10 by directing it up and away from the enclosure 10.

Each of the panels 54,56 of the exhaust air duct 14 has a flange 46 at a bottom edge 48 thereof for attachment to the top panel 38 of the enclosure 10 around a rim 50 of the top panel opening 42. A top edge 52 of the exhaust air duct 14 may be connected to a room's return air duct, as shown schematically in FIG. 12. As will be evident to the Ordinary Artisan, it may be desirable to include additional features at the top edge 52 of the duct 14, such as a mounting flange (not shown) extending around the periphery thereof, to facilitate such connection. However, the self-supporting nature of the exhaust air duct 14 enables it to be positioned upright without any support from such a return air duct. Still more preferably, the height of exhaust air duct 14 may be adjustable for use in rooms with varying ceiling heights. In order to facilitate such adjustability, the exhaust air duct 14 may have a telescoping design or some other design capable of adjustability. Such adjustability may be further enhanced by the self-supporting nature of the exhaust air duct 14. In contrast, conventional air ducts must be attached at either end to a support because they are not self-supporting, therefore, conventional air ducts lose the freedom of adjustability that is available in the exhaust air duct 14 of the present invention.

Figure 9:
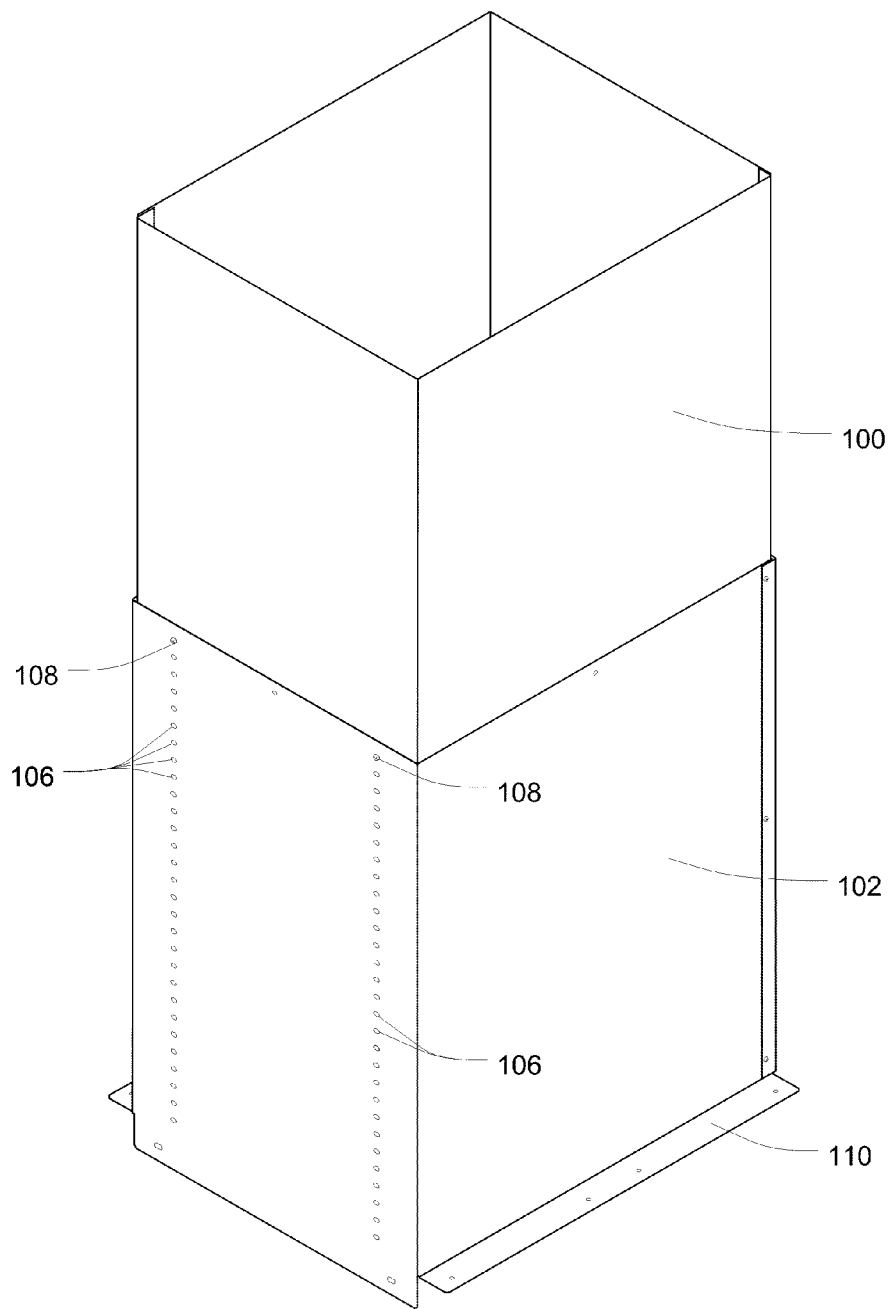
FIG. 9 is an isometric view of an exemplary telescoping exhaust air duct for use with the ducted exhaust equipment enclosure of FIG. 1.

FIG. 9 is an isometric view of an exemplary telescoping exhaust air duct 98 for use with the ducted exhaust equipment enclosure of FIG. 1. The telescoping duct 98 comprises two duct sections 100,102 having a somewhat similar construction to that described above for the exhaust air duct 14. More particularly, both duct sections 100,102 are open-ended and have a rectangular cross-section defined by front and back panels and left and right panels. The telescoping duct 98 includes a first duct section 100 with a rectangular cross-section that is slightly smaller in cross-section than a second duct section 102, within which the first duct section 100 nests. The telescoping duct 98 preferably includes a means for fixing the total height of the duct 98 once it has been adjusted, i.e., once the relation of the first duct section 100 to the second duct section 102 has been decided. In the present embodiment, each of two opposing panels of the first duct section 100 includes a pair of openings (not shown), with each opening being disposed near opposite lower corners of the panels. These openings may be disposed in front and back panels or left and right panels, depending on the orientation of the telescoping duct 98 when it is installed in the enclosure 10. Each of two opposing panels of the second duct section 102 includes a pair of columns of openings 106, preferably evenly-spaced, that are disposed near side edges of the panels. When the telescoping duct 98 is assembled, the opposing panels of the first duct section 100 having the pair of openings described above are aligned with the opposing panels of the second duct section 102 having the columns of corresponding openings 106. In this arrangement, the openings of the first duct section 100 may be adjusted vertically until the openings are aligned with a desired set of openings 106 of the second duct section 102. Thus, the first duct section 100 may be moved upwardly or downwardly, thereby extending or retracting the height of the telescoping duct 98, until the desired height is reached. At this point, the four openings of the first duct section 100 should be aligned with four openings 106 of the second duct section 102 that lie in the same horizontal plane. Bolts or other fasteners 108, or some other similarly functioning connection means (such as a spring-loaded pin or the like) may be inserted through the aligned openings of the first 100 and second duct sections 102 to fix the height of the telescoping duct 98. If it is subsequently desired to adjust the height, the bolts 108 may be removed and the first duct section 100 slid upwardly or downwardly until the new desired height is reached.

In the telescoping duct 98, the second duct section 102 may include a flange 110 at bottom edges of the opposing panels that do not have the columns of openings 106. The telescoping duct 98 may be connected to the enclosure 10 using the flanges 110. In addition, the panels that include the columns of openings 106 may have a bottom edge that extends slightly lower than the bottom edges of the other panels. These bottom edges may extend into the opening 42 of the top panel 38 of the enclosure 10. As will be evident to the Ordinary Artisan, the dispositions of these elements may be changed as desired.

Referring back to FIG. 8, front and back panels 54 of the exhaust air duct 14 include additional flanges 58 at side edges thereof. The flanges 58 of the front and back panels 54 fold around side edges of the right and left panels 56 at the corners of the rectangular shaped exhaust air duct 14. Any known connection means, such as screws, may be used to join the exhaust air duct panels 54,56 using the flanges 58 of the front and back panels 54. This arrangement further improves the rigidity of the exhaust air duct 14.

Because of the positioning of the exhaust air duct 14 on the enclosure 10, the back panel 54 thereof is nearly vertically aligned with a vertical plane of the back panel 40 of the enclosure 10. Further, because the rectangular shape of the exhaust air duct 10 is similar to the rectangular shape of the back of the enclosure 10, exhaust air flows freely through the exhaust air duct 14. In contrast, in a conventional cylindrical exhaust air duct, air from the back of the angularly shaped enclosure, particularly the corners of the enclosure, must take a tortuous and winding path in order to exit the server enclosure. This relatively complex air flow scheme decreases the rate at which and the amount of air that may exit the enclosure. Further because the rectangular exhaust air duct 14 is similar in shape to the back of the enclosure 10 itself, it can be made larger in cross-section than conventional cylindrical ducts, thus allowing for more airflow through the exhaust air duct 14. Accordingly, the rectangular cross-section of the exhaust air duct 14 facilitates increased transfer of thermal energy from the enclosure 10 in comparison to conventional enclosures with conventional exhaust air ducts 14 because of the increased exhaust air flow rate and the decreased resistance to flow permitted by the size, shape and smooth panels of the rectangular exhaust air duct 14.

Figure 13:
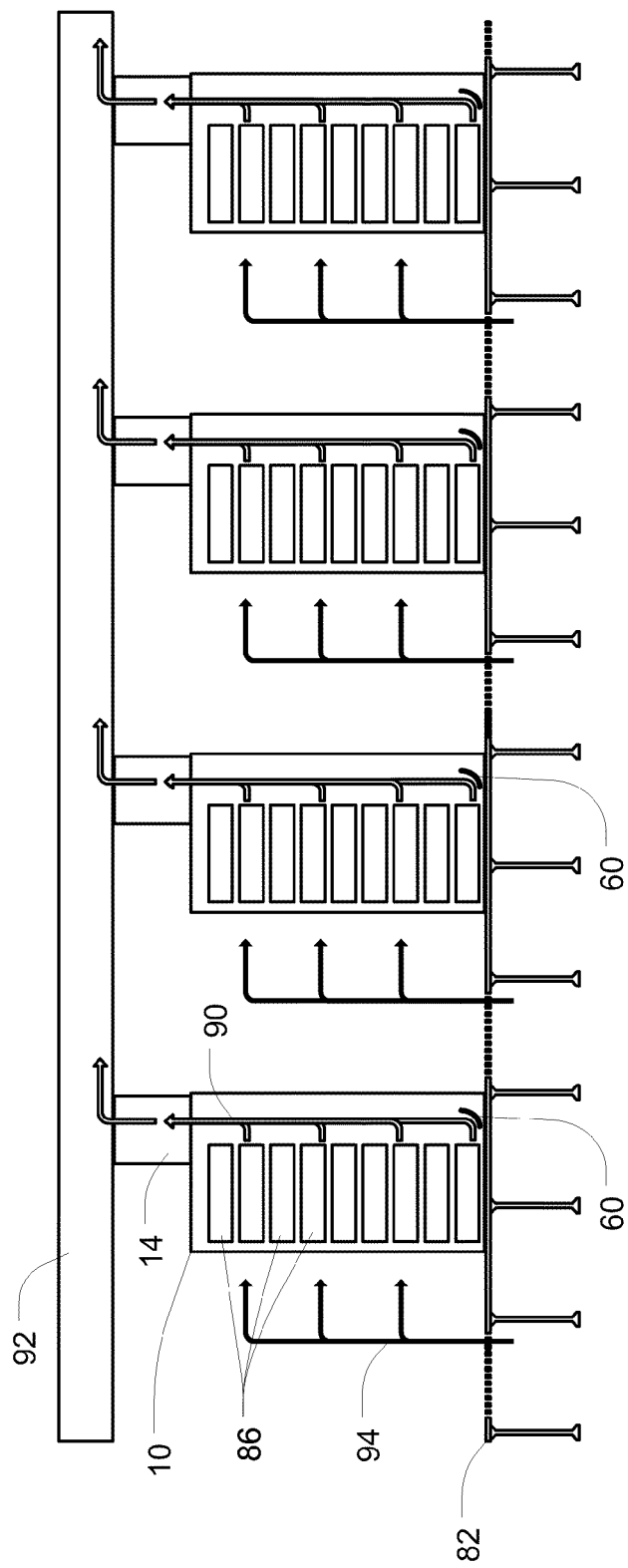
FIG. 13 is a schematic illustration of a series of ducted exhaust equipment enclosures.

As shown in FIG. 13, the exhaust air duct 14 may be connected to a room's exhaust air removal system, which commonly includes a return air duct. However, the exhaust air duct 14 does not have to be connected to a return air duct. The enclosure 10 may vent directly into the room into which the enclosure 10 is placed. This approach is more useful in rooms that have high ceilings into which to vent the hot air, however, the natural buoyancy of hot air will keep the hot vented air at or near the top of the room into which it is vented.

The enclosure 10 may be used in connection with a hot aisle/cold aisle configuration of a data center or computer room. If a series of enclosures 10 are arranged in a row in such configuration, the exhaust air ducts 14 form a vertical wall rising from the tops of the enclosures 10 due to their size and shape. This vertical wall may serve as a barrier to recirculation, thereby improving the performance of the hot aisle/cold aisle thermal system.

Figure 10:
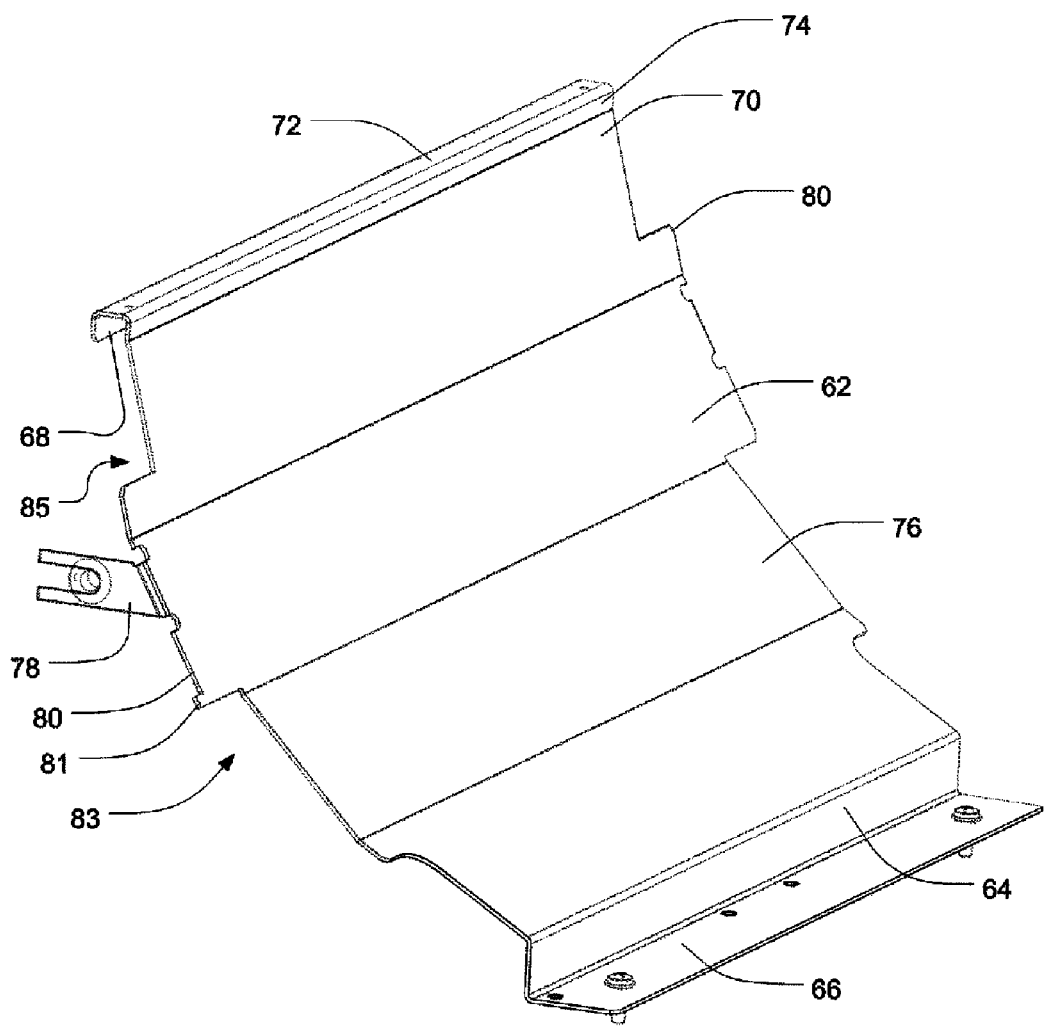
FIG. 10 is a front orthogonal view of the scoop of FIG. 7.

As seen in FIG. 7, the enclosure 10 may also include an air flow director or air diverter 60 located near the bottom of the enclosure 10 and generally directly beneath the opening 42 for the exhaust air duct 14. FIG. 10 is a front orthogonal view of the air diverter 60 of FIG. 7. As shown therein, the air diverter 60 comprises a panel 62 having a series of creases or bends therein so as to create a generally scoop-shaped structure. Preferably, the creases or bends are generally regularly spaced such that cross-section of the structure approximates an arc, as evident from FIG. 7. Of course, it will be evident to the Ordinary Artisan that alternatively the structure may, in fact, have a uniformly curved (non-planar) cross-section, but the use of a panel 62 that is bent or creased to approximate an arc cross-section may improve manufacturability. Further, it will be evident that while the present embodiment comprises a generally curved structure, it is important to note that the air diverter 60 may comprise any shape that creates a scoop effect for air flowing through the enclosure 10.

The air diverter 60 has a width that at its maximum is substantially the same as the distance between the horizontal mounting rails 28. The air diverter 60 includes a pair of wing elements 80 disposed opposite one another on opposite side edges of the air diverter 60. The wing elements 80 extend beyond the side edges of the air diverter 60 such that they essentially span the entire distance between the horizontal mounting rails 28. A bottom edge 64 of the air diverter 60 has a flange 66 for connecting the air diverter 60 to the bottom panel 36 of the enclosure 10. Any known connection means may be used to join the air diverter 60 to the bottom panel 36 of the enclosure 10. Alternatively, the air diverter 60 may be left unfastened to the bottom panel 36, thereby permitting the air diverter 60 to be relocated forward or backward from the location illustrated in FIG. 7. If left unfastened, it is useful to include means for preventing the air diverter 60 from being rotated upward by the forces applied by cables as described hereinbelow. One such means is a small protuberance 81 that may be included on the wing elements and that hooks underneath the horizontal mounting rails 28 to which the diverter 60 is attached as described below.

The air diverter 60 further includes a "U"-shaped channel member 68 disposed at a top edge 70 thereof. The channel member 68 includes a top surface 72 and two side surfaces 74 extending from the top surface 72. One of the side surfaces 74 is attached to the top edge 70 of the air diverter 60. The channel member 68 is arranged such that the top surface 72 thereof extends away from a front surface 76 of the air diverter 60. The channel member 68 provides rigidity for the air diverter 60.

The channel member 68 also serves another purpose, as next described. As can be seen in FIG. 7, the enclosure 10 includes a cable openings 96 located behind and beneath the air diverter 60 and in the top panel 38. Cables (not shown) used to power components or supply data to or from components stored in the enclosure 10 can be routed through the cable openings 96. In particular, it is contemplated that a substantial number of cables may be disposed between the back panel 40 of the enclosure 10 and the air diverter 60, and in fact, the back of the air diverter 60 may aid in forcing the cables toward the rear of the enclosure 10. Such cables may exert a considerable amount of tension on the back of the air diverter and particularly on the uppermost and/or rearmost surfaces of the channel member 68. If these surfaces are rough, they could potentially cause considerable chafing on the surfaces of the cables, thereby damaging them. Advantageously, because the distal edge of the channel member 68 is pointed downward, the cables instead make contact with the relatively smooth surfaces of the top and side surfaces 72,74, thereby protecting the cables from damage. In this regard, in at least one alternative embodiment (not illustrated), the channel member 68 may be replaced by an arcuate member that provides a minimum radius of curvature, thereby preventing cables from being bent unnecessarily.

The air diverter 60 further includes a pair of connection tabs 78 disposed on the wing elements 80 thereof. The wing elements 80 are generally positioned at a height corresponding to the elevation of the lowermost horizontal mounting rail 28 within the enclosure 10, and the tabs 78 therefore provide a means for the air diverter 60 to be connected to a pair of horizontal mounting rails 28 of the enclosure 10 using the mounting rail slots, described previously and visible in FIG. 7. Further, any known connection means may be used to connect the air diverter 60 to the bottom panel 36 of the enclosure 10 as desired.

Notably, although not shown, because the wing elements 80 extend out from the side edges of the air diverter 60, the vertical mounting rails 30 may alternatively be disposed between the side edges of the air diverter 60 and the horizontal mounting rails 28 in the inset areas 83,85 located above and below the wing elements 80. Thus, the vertical mounting rails may be arranged by a user at nearly any location along the horizontal mounting rails 28 from the front to the back of the enclosure 10, other than where the wing elements 80 are present. The lower inset area 85 also provides another function, in that cables entering the bottom of the enclosure 10 may be routed forward almost immediately after entering the enclosure using the space provided by the lower inset area 85. In the absence of such a space, cables would have to be routed up and over the wing elements, thus making the cables unnecessarily long.

Figure 11:
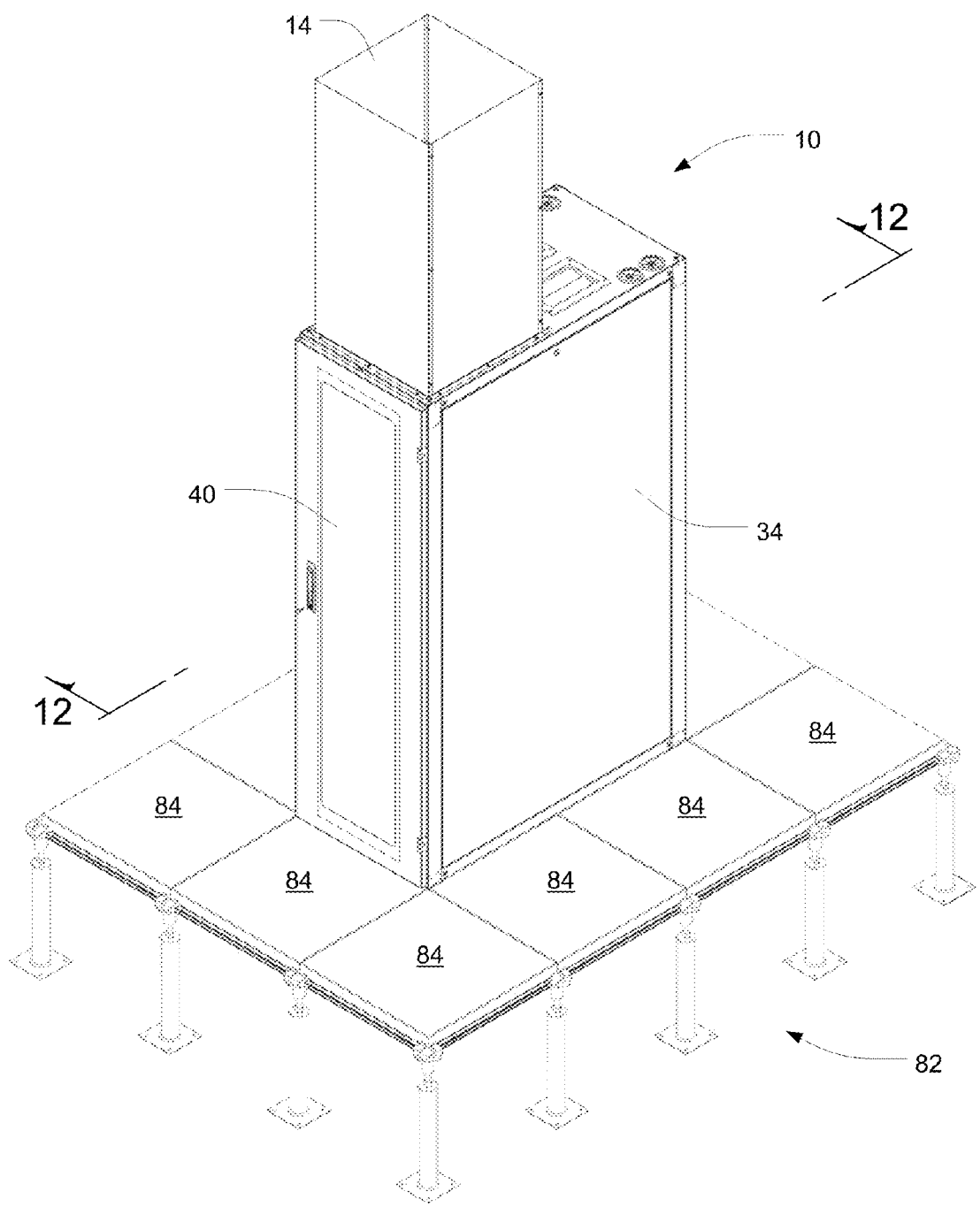
FIG. 11 is a rear isometric view of the ducted exhaust equipment enclosure of FIG. 1, shown installed on a raised floor.
Figure 12:
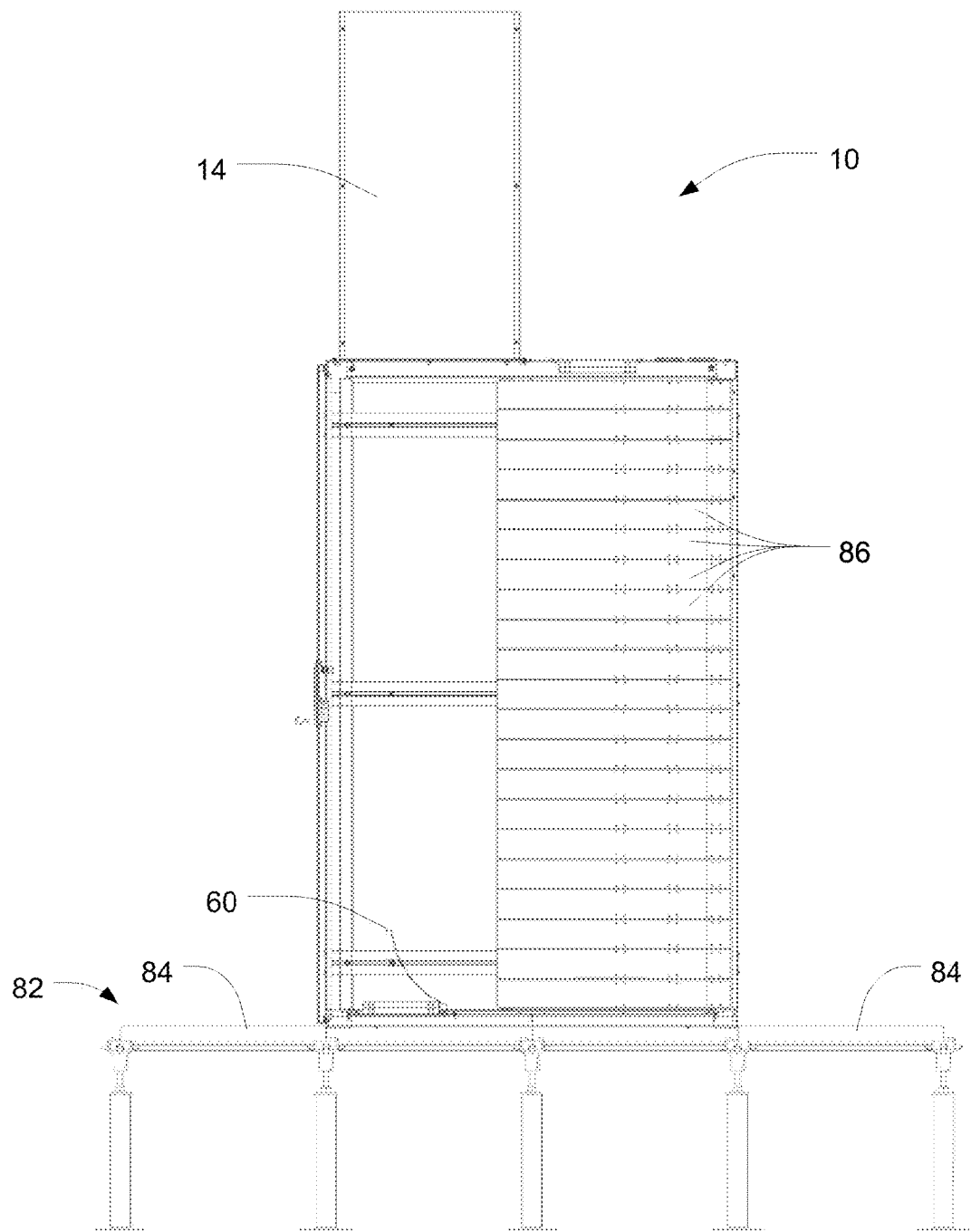
FIG. 12 is a side cross-sectional view of the ducted exhaust equipment enclosure of FIG. 11, taken along the line 12-12.

In use, the ducted exhaust equipment enclosure 10 is typically, though not always, installed on a raised floor 82. FIG. 11 is a rear isometric view of the ducted exhaust equipment enclosure 10 of FIG. 1, shown installed on a raised floor 82, and FIG. 12 is a side cross-sectional view of the ducted exhaust equipment enclosure 10 of FIG. 11, taken along the line 11-11. The raised floor 82 includes a plurality of floor panels or tiles 84 of standard size and conventional design, all supported above the permanent floor at a desired height. The floor tiles 84 conventionally include solid tiles as well as perforated or ventilated tiles, the latter of which are designed to permit cool air supplied from the space beneath the floor 82, commonly referred to as the raised floor plenum, to flow therethrough. In particular, a ventilated tile may be located directly in front of the enclosure 10 to provide the most direct path to the interior of the enclosure and the air intakes for the equipment 86 located inside. Further, although not specifically illustrated herein, the area directly underneath such an enclosure 10 is often left fully or partially open by eliminating one or more tiles 84, by using tiles 84 with large openings therein, or by using tiles 84 that are less than full-size.

FIG. 13 is a schematic illustration of a series of ducted exhaust equipment enclosures 10 showing cool air flowing in and hot return air flowing out. As shown in FIGS. 11 and 12, once one or more enclosures 10 are installed on the raised floor 82, electronic equipment 86 is installed in the various equipment enclosures 10, typically by attaching the equipment 86 to the vertical mounting rails 30, and operated normally. As described previously, the equipment 86 generates considerable thermal energy while it operates. The thermal energy is carried by air currents which may be forced or forcibly drawn out of the rear of the various active pieces of equipment 86 by internal fans (not shown), often supplemented by separate fans (not shown) mounted in or on the enclosures 10. The air-impervious rear door 40 prevents heated air from escaping out the rear of the enclosure 10 where it would mix with cool air outside and be drawn back through the enclosures 10. Heated air near the bottom of each enclosure 10 is further redirected upward by the air diverters 60. The heated air is then exhausted through the exhaust air ducts 14 as represented by arrows 90, and into the return air duct 92. Once there, the heated air is handled by the CRAC, sometimes in combination with additional ducts, fans, partitions, and/or other equipment (not shown).

At the same time, cool air, represented by arrows 94, flows up through the perforated tiles 84 and in through the front of the enclosure 10, thereby facilitating the flow of air through the enclosure 10 and cooling the equipment 86 mounted therein. Although not shown, cool air is often also guided through the openings directly beneath the enclosure 10. Care must be taken to force such air to the front of the equipment 86 to avoid letting it escape immediately up the back of the enclosure 10.

Thus, the ducted exhaust equipment enclosure 10 allows the components 86 stored therein to draw the required volume of air through the enclosure 10, and then directs the exhaust out of and away from the enclosure 10 thereby eliminating the problem of air recirculation. The ducted exhaust equipment enclosure 10 segregates hot exhaust air by directing it up an exhaust air duct 14 at the top rear of the enclosure 10. This approach delivers enhanced cooling of components resulting in a more efficient use of available cool air and better overall heat transfer away from components.

Preferably, and as shown in FIG. 13, the exhaust air duct 14 is connected to a drop ceiling return air plenum. However, this is not necessary where high ceilings can offer sufficient clearance for the return air to stratify above the cold air in the room.

Several benefits become obvious with this architecture. For example, enclosures 10 do not have to be oriented front-to-front and back-to-back along hot aisle/cold aisle rows, as they do with conventional hot aisle/cold aisle arrangements. This freedom allows enclosure arrangements to be driven by other infrastructure requirements. In addition, up to 100% of the exposed floor can be perforated. Perforated tiles 84 can be located anywhere in the room. Using ducted exhaust equipment enclosures 10 allows the entire data center to be cold, i.e., no more hot zones. Cold intake air can be pulled from anywhere in the room. An enclosure 10 no longer has to obtain all of the airflow needed from the raised floor tile directly in front or adjacent to it. As such, airflow balancing issues are significantly reduced, if not, alleviated. By enabling cold air to be delivered through 100% of the tile in the raised floor 82, it is contemplated that the airflow available to any given enclosure 10 can be doubled thereby doubling the heat load capacity of the enclosure 10.

It is important to note that because the ducted exhaust equipment enclosures can be used in data centers both with raised floors 82 or without raised floors 82, they are extremely versatile. The ducted exhaust equipment enclosures 10 can be used in rooms with or without a raised floor 82 and can be partially or completely cooled using a raised floor plenum or by an alternative cooling means such as ducts within a data center. Accordingly, the following scenarios are possible with the ducted exhaust equipment enclosures: 1) a data center wherein cold air is supplied using only a raised floor approach, 2) a data center wherein no raised floor is present and cold air is supplied using only alternative approaches to a raised floor, e.g., ducts in the room, 3) a data center wherein a raised floor 82 is present but cold air is supplied by ducts in the room, and 4) a data center wherein cold air is partially supplied by ducts in the room and partially supplied by a raised floor plenum.

Use of the ducted exhaust equipment enclosures 10 also creates the opportunity to deploy high density applications in a non-raised floor environment because cold air can be delivered directly into the room rather than through a raised floor. In addition, the use of ducted exhaust equipment enclosures 10 avoids any dependency on booster fans, with the accompanying concerns over additional heat loads, fan failure and redundancy, thereby reducing the cost of equipping a data center.

In the process described above, each air diverter 60 reduces or eliminates eddies that would otherwise be present in the hot return air at the bottom rear of the enclosure 10. Such eddies can cause computer components mounted at the bottom of the enclosure 10 to operate at a higher temperature than components mounted higher up in the enclosure 10. The air diverter 60 reduces or eliminates such eddies by turning hot return air upward in the direction of primary flow of hot return air. It is contemplated that intermediate half-scoop air diverters (not shown) may also be added at various vertical spacing locations along the back of the enclosure 10. These intermediate half-scoops of various sizes and shapes may be used to further improve air flow and air balance. Advantageously, although the exhaust air duct 14 may be used by itself, the various scoops help start the vertical flow of heated air up toward the duct 14, thereby making it function more efficiently than if used by itself.

The enclosure 10 may include additional features to aid in airflow management of the enclosure 10. One such feature is the inclusion of metal bracket seals 88 around the connection means used to connect the back door panel 40 to the enclosure 10. The seals 88 further ensure that exhaust air exits the enclosure 10 via the exhaust air duct 14 rather than through small openings around the connection means or edges of the door. Further, foam or rubber gaskets (not shown) may be added to, or may replace, the metal bracket seals 88 to create a further barrier to air release.

Another contemplated feature is a brush opening in the bottom panel 36 of the enclosure 10. Often an enclosure will have an opening in the bottom panel thereof for receipt of cables that provide power and other input or output to the components stored in the enclosure. Unfortunately, air is able to flow freely through the opening thereby altering the intended airflow scheme of the enclosure. It is possible to include a plurality of bristles extending inwardly from opposing sides of the opening such that exterior ends of the bristles are touching. The bristles essentially cover the opening thereby preventing air from flowing there through. In the same instance, the cables are still able to pass through the opening by displacing the bristles for their passage there through. Although, the brushes are not shown in FIG. 7, it is contemplated that the cable opening 96 of the enclosure 10 will be a brush opening Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. An air diverter for an electronic equipment enclosure, comprising:
   (a) a generally scoop-shaped structure, including a wing element extending from each side thereof, the scoop-shaped structure having at least two planar sections that collectively define a radius of curvature forming an arc;
   (b) a flange at a bottom edge of the scoop-shaped structure for connecting the air diverter to an enclosure; and (c) a pair of connection tabs disposed at side edges of the scoop-shaped structure for further connecting the air diverter to the enclosure.

2. The air diverter of claim 1, wherein each connection tab is adapted to be attached directly to a mounting rail of the enclosure.

3. The air diverter of claim 1, wherein each connection tab extends perpendicularly from a respective wing element.

4. The air diverter of claim 1, wherein each wing element defines at least one inset area for accommodating cables within the enclosure.

5. The air diverter of claim 1, wherein the bottom edge flange is adapted to connect the air diverter directly to a bottom panel of the enclosure.

6. The air diverter of claim 1, wherein the at least two planar sections include at least three evenly-spaced planar sections.

7. An air diverter for an electronic equipment enclosure, comprising:
(a) a generally scoop-shaped structure having at least two planar sections that collectively define a radius of curvature forming an arc;
(b) a flange at a bottom edge of the scoop-shaped structure for connecting the air diverter to an enclosure;
(c) a pair of connection tabs disposed at side edges of the scoop-shaped structure for further connecting the air diverter to the enclosure; and
(d) a "U"-shaped channel member disposed at a top edge thereof the generally scoop-shaped structure.

8. The air diverter of claim 7, wherein each connection tab is adapted to be attached directly to a mounting rail of the enclosure.

9. The air diverter of claim 7, wherein the bottom edge flange is adapted to connect the air diverter directly to a bottom panel of the enclosure.

10. The air diverter of claim 7, wherein the air diverter includes a wing element extending from each side of the scoop-shaped structure.

11. The air diverter of claim 10, wherein each connection tab extends perpendicularly from a respective wing element.

12. The air diverter of claim 10, wherein each wing element defines at least one inset area for accommodating cables within the enclosure.

13. The air diverter of claim 7, wherein the at least two planar sections include at least three evenly-spaced planar sections.

14. An air diverter for an electronic equipment enclosure, comprising:
(a) a generally scoop-shaped structure, including a wing element extending from each side thereof, the scoop-shaped structure comprising a panel that has a series of creases or bends therein, thereby defining a radius of curvature forming an arc;
(b) a flange at a bottom edge of the panel for connecting the air diverter to an enclosure; and
(c) a pair of connection tabs disposed at side edges of the panel for further connecting the air diverter to the enclosure.

15. The air diverter of claim 14, wherein each connection tab is adapted to be attached directly to a mounting rail of the enclosure.

16. The air diverter of claim 14, wherein each connection tab extends perpendicularly from a respective wing element.

17. The air diverter of claim 14, wherein each wing element defines at least one inset area for accommodating cables within the enclosure.

18. The air diverter of claim 14, further including a protuberance, extending from each wing element, adapted to contact a horizontal mounting rail within the enclosure.

19. The air diverter of claim 14, wherein the bottom edge flange is adapted to connect the air diverter directly to a bottom panel of the enclosure.

20. The air diverter of claim 14, wherein the series of creases or bends are evenly spaced.

21. An air diverter for an electronic equipment enclosure, comprising:
(a) a generally scoop-shaped structure comprising a panel that has a series of creases or bends therein, thereby defining a radius of curvature forming an arc;
(b) a flange at a bottom edge of the panel for connecting the air diverter to an enclosure;
(c) a pair of connection tabs disposed at side edges of the panel for further connecting the air diverter to the enclosure; and
(d) "U"-shaped channel member disposed at a top edge thereof the generally scoop-shaped structure.

22. The air diverter of claim 21, wherein each connection tab is adapted to be attached directly to a mounting rail of the enclosure.

23. The air diverter of claim 21, wherein the air diverter includes a wing element extending from each side of the scoop-shaped structure.

24. The air diverter of claim 23, wherein each connection tab extends perpendicularly from a respective wing element.

25. The air diverter of claim 23, wherein each wing element defines at least one inset area for accommodating cables within the enclosure.

26. The air diverter of claim 23, further including a protuberance, extending from each wing element, adapted to contact a horizontal mounting rail within the enclosure.

27. The air diverter of claim 21, wherein the bottom edge flange is adapted to connect the air diverter directly to a bottom panel of the enclosure.

28. The air diverter of claim 21, wherein the series of creases or bends are evenly spaced.

* * * * *